(12) United States Patent
Lee

(10) Patent No.: US 8,031,534 B2
(45) Date of Patent: Oct. 4, 2011

(54) SEMICONDUCTOR MEMORY DEVICE CAPABLE OF READ OUT MODE REGISTER INFORMATION THROUGH DQ PADS

(75) Inventor: Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 414 days.

(21) Appl. No.: 12/317,214

(22) Filed: Dec. 18, 2008

(65) Prior Publication Data
US 2010/0027358 A1    Feb. 4, 2010

(30) Foreign Application Priority Data
Aug. 4, 2008  (KR) .................. 10-2008-0076204

(51) Int. Cl.
*G11C 7/10* (2006.01)
(52) U.S. Cl. ............... 365/189.05; 365/222; 365/230.08
(58) Field of Classification Search .............. 365/189.05, 365/222, 230.08
See application file for complete search history.

(56) References Cited

U.S. PATENT DOCUMENTS 7,433,257 B2   10/2008  Yamagami
7,869,297 B2 *  1/2011  Kim .............................. 365/222

FOREIGN PATENT DOCUMENTS

JP   2000-030464   1/2000
JP   2004-079841   3/2004

* cited by examiner

*Primary Examiner* — Jason Lappas
(74) *Attorney, Agent, or Firm* — John P. White; Cooper & Dunham LLP

(57) ABSTRACT

A semiconductor memory device is provided that is capable of reading out mode register information stored in a register adapted for LPDDR2 (Low Power DDR2), through DQ pads. The semiconductor memory device includes a mode register control unit configured to receive address signals, a mode register write signal and a mode register read signal and generate a flag signal and at least one output information signal, and a global I/O line latch unit for transferring the output information signal to a global I/O line in response to the flag signal.

28 Claims, 6 Drawing Sheets

SEMICONDUCTOR MEMORY DEVICE CAPABLE OF READ OUT MODE REGISTER INFORMATION THROUGH DQ PADS

TECHNICAL FIELD

The present disclosure relates to a semiconductor memory device and, more particularly, to a semiconductor memory device capable of reading mode register information stored in a register adapted for LPDDR2 (Low Power DDR2), through a DQ pad.

BACKGROUND

Recently, it is very important to reduce the weight of mobile terminals, such as portable computers, PDA and handheld phones, in order to make it possible to effectively and easily carry them. The main part contributing to the weight of a mobile terminal is a battery to supply power to the terminal. Further, the less that a power consumption of a semiconductor memory chip used in the mobile terminal (hereinafter, referred to as "mobile memory chip") can be reduced, the more the capacity of the battery needs to be increased. Accordingly, the weight of the mobile terminal can be reduced by lowering power consumption of the semiconductor memory chip, and therefore additional research regarding power consumption of the mobile memory chip is still required to improve the mobile terminals.

Meanwhile, as mobile terminals develop into multimedia devices to provide various services, high speed operation is required to process a huge amount of data. Accordingly, high data transmission rate in the mobile memory chip is essential to improved operating speed of the mobile terminals and improvement in the data transmission rate is a key issue of the study on mobile memory chip.

Recently, a low power DDR2 (hereinafter, referred to as "LPDDR2") technique has been developed and this technique dramatically improves both the power consumption of the mobile terminals and the data transmission rate. The LPDDR2 technique can implement the data transmission rate of 800 Mbps, which is currently the highest in the industry, at a power supply voltage of 1.2V. Further, in the case where a method of manufacturing an ultra-fine line width of 66 nm is applied to the mobile memory chip, the mobile memory chip may have a package size of approximately 9 mm×12 mm.

In the LPDDR2 technique, a one-chip solution is provided. The function of the one chip solution is to provide various modifications of the data processing speed and operation modes in the mobile memory chip according to the operating environments of the mobile terminals in which the mobile memory chip is embedded.

As mentioned above, the LPDDR2 technique can reduce the power consumption dramatically and also increase the data transmission rate, and therefore the LPDDR2 technique has been widely used as an optimized memory device technique in the mobile terminal.

In the LPDDR2 technique, a mode register write operation, which writes mode register information in a plurality of registers, is prescribed in a specification; however, a mode register read operation, in which the mode register information is read out from the plurality of registers, is not prescribed in the specification.

SUMMARY

In an aspect of the present disclosure, a semiconductor memory device is provided that is capable of reading out mode register information stored in a register through DQ pads in the LPDDR2 technique.

In an embodiment, a semiconductor memory device includes a mode register control unit configured to receive address signals, a mode register write signal and a mode register read signal and generate a flag signal and at least one output information signal, and a global I/O line latch unit for transferring the output information signal to a global I/O line in response to the flag signal.

The mode register control unit includes a decoder for decoding the address signals and generating at least one information signal and first and second select signals, at lease one driver configured to receive the information signal and the first and second select signals and generate the output information signal in response to the mode register write signal and the mode register read signal, and a flag signal generating unit configured to receive the mode register read signal and a burst operation signal and generate the flag signal.

The driver stores the information signal in a register which is selected by the first and second select signals when the mode register write signal is enabled, and outputs the information signal stored in the register as the output information signal when the mode register read signal is enabled.

The driver includes a transfer unit including first and second transfer gates which are selectively turned on in response to the first and second select signals when the mode register write signal or the mode register read signal is enabled, a driving unit for driving a first node in response to the information signal when the mode register write signal is enabled, and a latch unit for outputting a signal on the first node to a second node and including a first register coupled to the second node through the first transfer gate which is turned on and a second register coupled to the second node through the second transfer gate which is turned on.

The transfer unit further includes a first logic unit for performing a logic operation of the mode register write signal and the mode register read signal, a second logic unit for performing a logic operation of an output signal of the first logic unit and the first select signal, and a third logic unit for performing a logic operation of an output signal of the second logic unit and the second select signal, wherein the first transfer gate is turned on by the output signal of the second logic unit and the second transfer gate is turned on by an output signal of the third logic unit.

The flag signal generating unit includes a pulse signal generating unit configured to receive the burst operation signal and generate a pulse signal, and a driving unit configured to receive the pulse signal and the mode register read signal and drive an output node.

The pulse signal generating unit includes a delay unit for delaying the burst operation signal for a predetermined time and inverting the delayed burst operation signal, and a logic unit for performing a logic operation of the burst operation signal and an output signal of the delay unit.

The driving unit includes a pull-up element coupled between a power supply voltage and the output node to perform a pull-up operation at the output node in response to the pulse signal, and a pull-down element coupled between the output node and a ground voltage level to perform a pull-down operation at the output node in response to the mode register read signal.

The global I/O line latch unit includes a driving unit configured to receive the output information signal and drive an output node in response to the flag signal, and a latch unit for latching a signal on the output node and transferring the latched signal to the global I/O line.

The driving unit drives the output node in response to the output information signal when the flag signal is enabled.

The burst control unit enables one of the plurality of burst length signals, which is preset, when the flag signal is enabled.

The burst control unit includes a first logic unit for performing a logic operation of a first initial burst length signal and the flag signal, and a second logic unit for performing a logic operation of a second initial burst length signal and an inverted signal of the flag signal.

In another embodiment, a semiconductor memory device includes a command address buffer unit for buffering command address signals and then extracting address signals and command signals, a command decoder for decoding the command signals in synchronization with an internal clock signal and then generating a mode register write signal and a mode register read signal, a mode register control unit configured to receive the address signals, the mode register write signal and the mode register read signal and generate a flag signal and at least one output information signal, a latch unit for transferring the output information signal to a global I/O line in response to the flag signal, and a burst control unit for setting up and outputting a plurality of burst length signals in response to the flag signal.

In still another embodiment, a semiconductor memory device includes a global I/O line latch unit for transferring at least one output information signal to a global I/O line in response to a flag signal which is enabled in response to a mode register read signal, wherein the output information signal is stored in at least one register by a mode register write operation, and DQ pads configured to receive the output information signal from the global I/O line through a pipe latch unit.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 1:
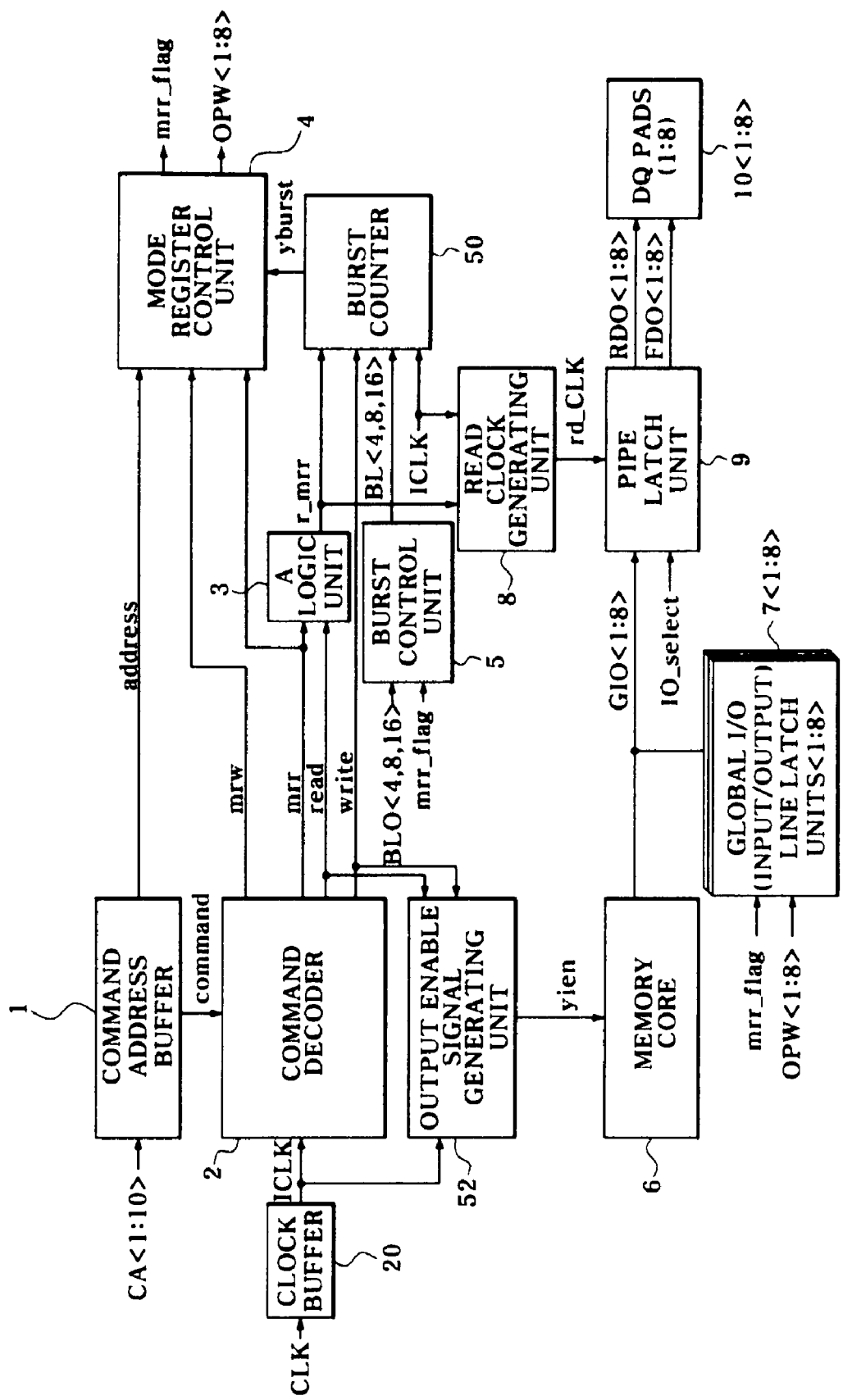
FIG. 1 is a block diagram illustrating an example of a structure of a semiconductor memory device according to an embodiment of the present disclosure.

FIG. 1 is a block diagram illustrating an example of a structure of a semiconductor memory device according to an embodiment of the present disclosure.

Referring to FIG. 1, a semiconductor memory device according to the present disclosure includes a command address buffer 1, a command decoder 2, a clock buffer 20, a logic unit 3, a mode register control unit 4, a burst control unit 5, a burst counter 50, an output enable signal generating unit 52, a memory core 6, first to eighth global I/O (input/output) line latch units 7<1:8>, a read clock generating unit 8, a pipe latch unit 9, and first to eighth DQ pads 10<1:8>.

The command address buffer 1 buffers first to ninth command address signals CA<1:9> and extract address and command signals. In the LPDDR2 technique, the address and command signals are applied to the command address buffer 1 as one signal.

The command decoder 2 decodes the command signals in response to an internal clock signal ICLK, which is generated by the clock buffer 20, and then outputs a first read signal read, a write signal write, a mode register write signal mrw, and a mode register read signal mrr.

The logic unit 3 performs a logic summation of the first read signal read and the mode register read signal mrr and generates a second read signal r_mrr. The second read signal r_mrr is enabled at a high level when the first read signal read or the mode register read signal mrr is enabled at a high level.

The mode register control unit 4 receives the address signals address, the mode register write signal mrw and the mode register read signal mrr and then outputs a flag signal mrr_flag and first to eighth output information signals OPW<1:8>.

Figure 2:
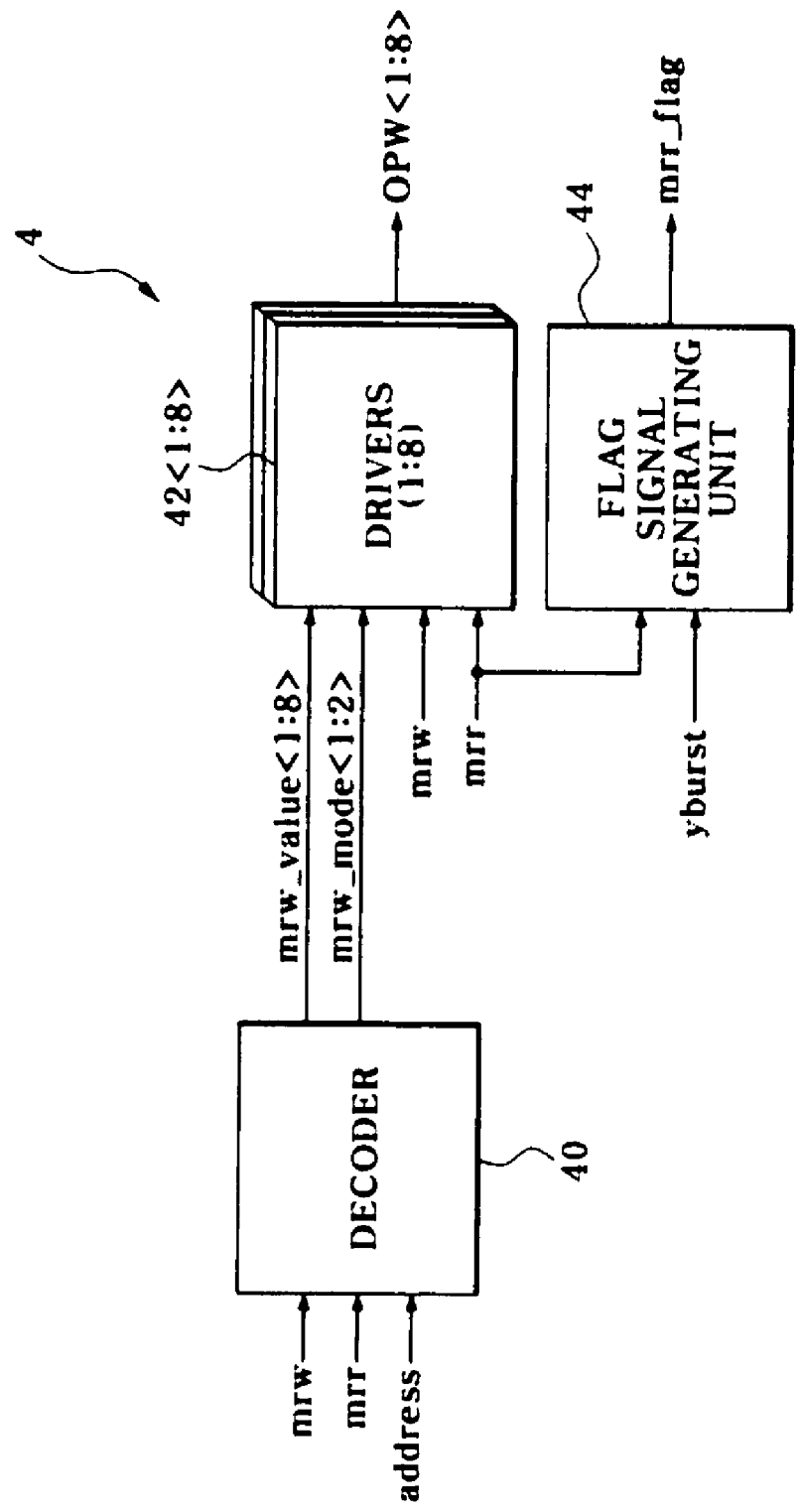
FIG. 2 is a block diagram illustrating an example of a structure of a mode register control unit in the semiconductor memory device of FIG. 1.

Referring to FIG. 2, the mode register control unit 4 includes a decoder 40, first to eighth drivers 42<1:8> and a flag signal generating unit 44.

The decoder 40 generates first to eighth information signals mrw_value<1:8> and first and second select signals mrw_mode<1:2> by decoding the address signals address in response to the mode register write signal mrw and the mode register read signal mrr. Here, first to eighth information signals mrw_value<1:8> and the first and second select signals mrw_mode<1:2> can be set up variously based on the user's demands and the number of them can be variously adjusted according to the embodiments of the present disclosure.

Figure 3:
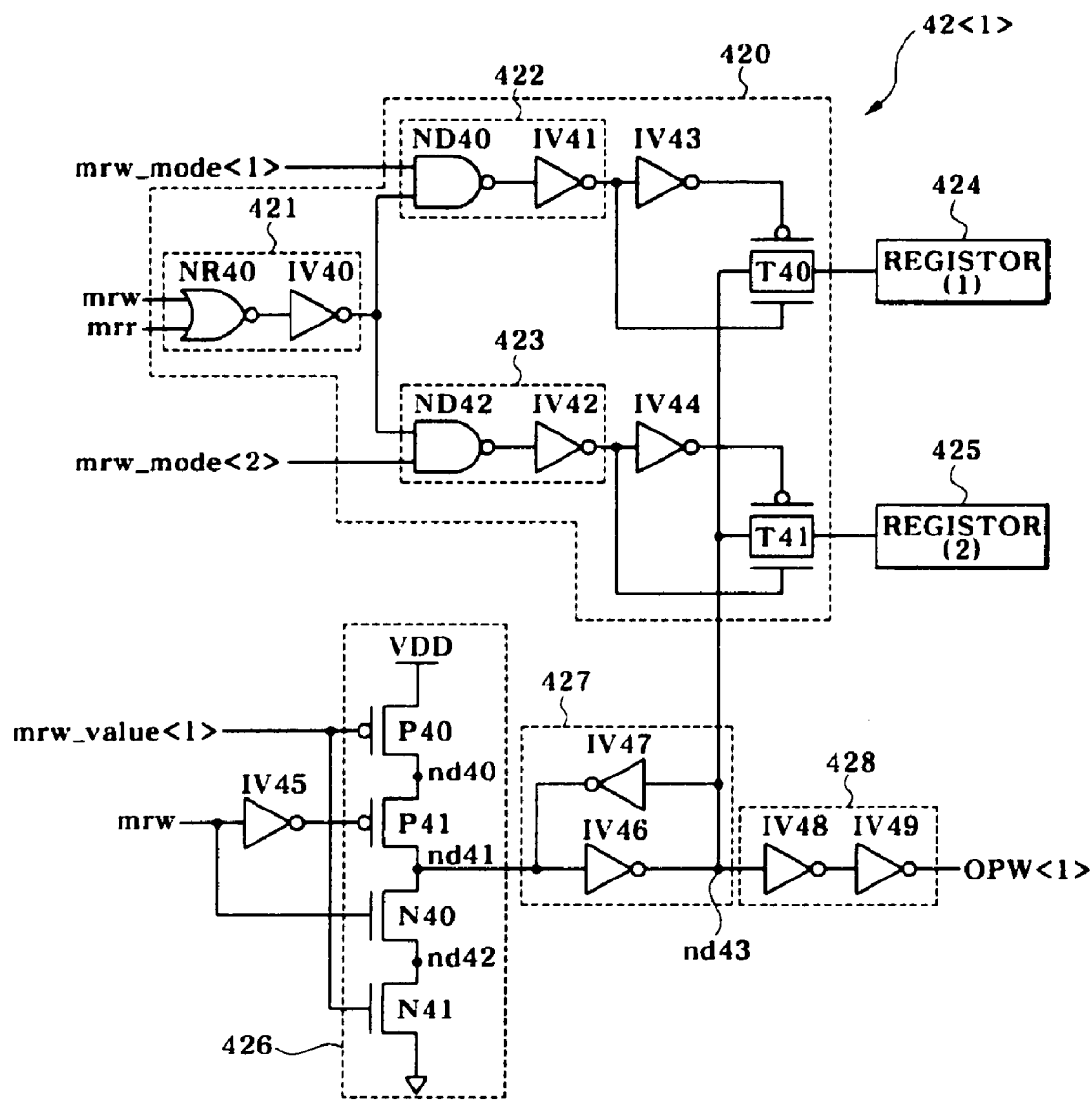
FIG. 3 is a circuit diagram illustrating an example of a structure of a first driver in the mode register control unit of FIG. 2.

Referring to FIG. 3, the first driver 42<1> includes a transfer unit 420, a first register 424, a second register 425, a driving unit 426, a latch unit 427, and a buffer unit 428.

The transfer unit 420 includes a logic unit 421 configured to perform logic summation of the mode register write signal mrw and the mode register read signal mrr, a logic unit 422 configured to perform logic multiplication of an output signal of the logic unit 421 and the first select signal mrw_mode<1>, a logic unit 423 configured to perform logic multiplication of the output signal of the logic unit 421 and the second select signal mrw_mode<2>, a transfer gate T40 which is turned on in response to an output signal of the logic unit 422, and a transfer gate T41 which is turned on in response to an output signal of the logic unit 423.

The driving unit 426 includes a PMOS transistor P40 coupled between the power supply voltage VDD and a node nd40 and turned on in response to the first information signal mrw_value<1>, a PMOS transistor P41 coupled between the node nd40 and a node nd41 and turned on in response to an inverted signal of the mode register write signal mrw, an NMOS transistor N40 coupled between the node nd41 and a node nd42 and turned on in response to the mode register write signal mrw, and an NMOS transistor N41 coupled between the node nd42 and a ground voltage level VSS and turned on in response to the first information signal mrw_value<1>.

The latch unit 427, which includes inverters IV46 and IV47, latches the signals on the node nd41 and a node nd43. The buffer unit 428 includes inverters IV48 and IV49 and outputs the first output information signal OPW<1> by buffering the signal on the node nd43.

In the case of the second to eighth drivers 42<2:8>, each of which has the same configuration as the first driver 42<1>, the respective second to eighth information signals mrw_value<2:8> are input instead of the first information signal mrw_value<1>, and the respective second to eighth output information signals <2:8> are outputted instead of the first output information signal <1>. Accordingly, the detailed description will be omitted.

Figure 4:
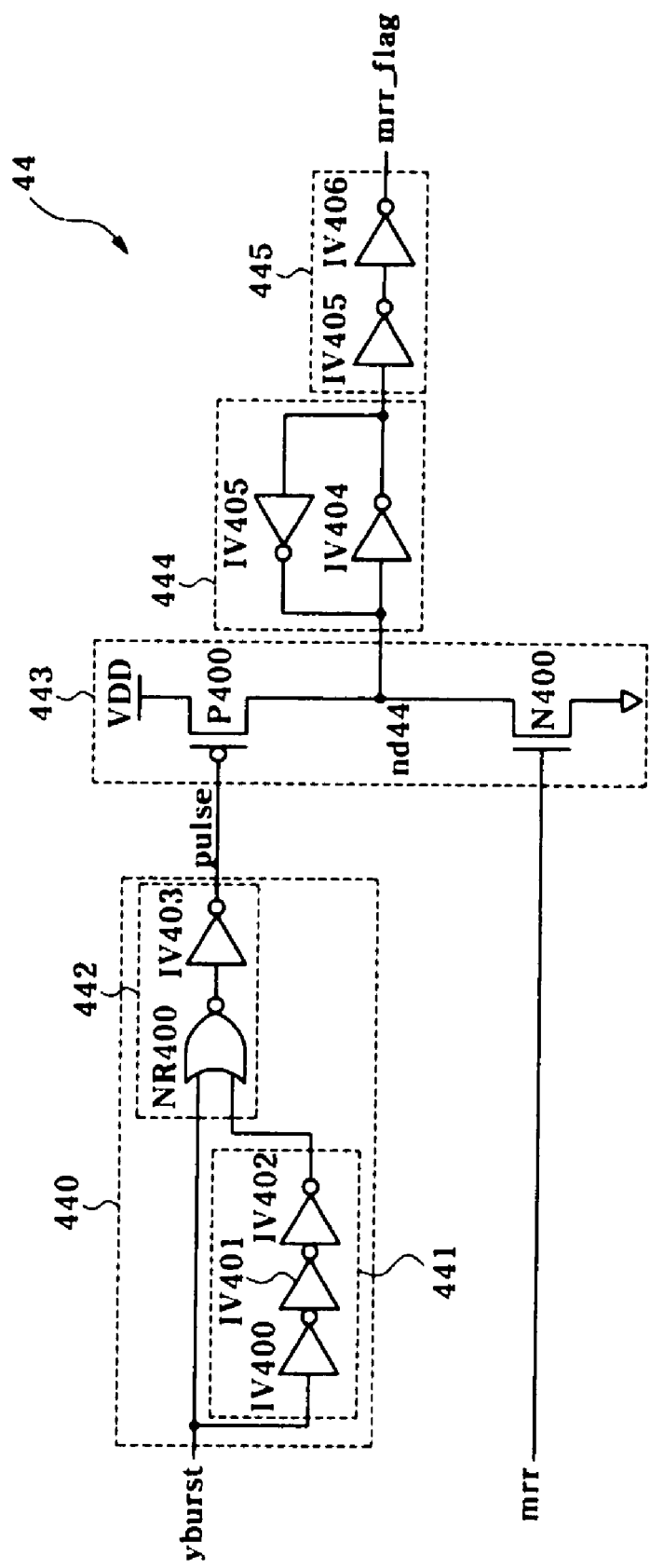
FIG. 4 is a circuit diagram illustrating an example of a structure of a flag signal generating unit in the mode register control unit of FIG. 2.

As shown in FIG. 4, the flag signal generating unit 44 includes a pulse signal generating unit 440, a driving unit 443, a latch unit 444, and a buffer unit 445.

The pulse signal generating unit 440 includes a delay unit 441 configured to delay a burst operation signal yburst, which is enabled during a burst operation section, for a predetermined time, and a logic unit 442 configured to generate a pulse signal pulse by performing a logic summation of the burst operation signal yburst and an output signal of the delay unit 441.

The driving unit 443 includes a PMOS transistor P400 coupled between the power supply voltage VDD and a node nd44 and turned on in response to the pulse signal pulse, and a NMOS transistor N400 coupled between the node nd44 and the ground voltage level VSS and turned on in response to the mode register read signal mrr. The latch unit 444 latches a signal on the node nd44. The buffer unit 445 generates the flag signal mrr_falg by buffering an output signal of the latch unit 444.

Figure 5:
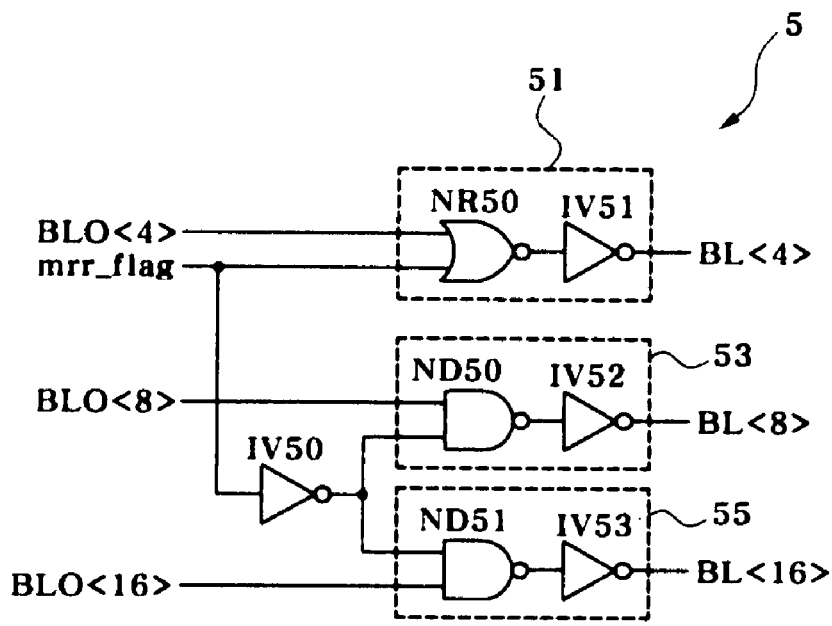
FIG. 5 is a circuit diagram illustrating an example of a structure of a burst control unit in the semiconductor memory device of FIG. 1.

The burst control unit 5 receives first to third initial burst length signals BLO<4>, BLO<8> and BLO<16>, which are preset before the mode register read signal mrr is inputted, and the flag signal mrr_flag and then generates first to third burst length signals BL<4>, BL<8> and BL<16>. In more detail, as shown in FIG. 5, the burst control unit 5 includes a logic unit 51 configured to generate the first burst length signal BL<4> by performing a logic summation of the first initial burst length signal BLO<4> and the flag signal mrr_flag, a logic unit 53 configured to generate the second burst length signal BL<8> by performing a logic multiplication of the second initial burst length signal BLO<8> and the flag signal mrr_flag, and a logic unit 55 configured to generate the third burst length signal BL<16> by performing logic multiplication of the third initial burst length signal BLO<16> and the flag signal mrr_flag. In this configuration, the burst control unit 5 enables only the first burst length signal BL<4> at a high level when the flag signal mrr_flag is at a high level.

The burst counter 50 receives the second read signal r_mrr, the internal clock signal ICLK, and the first to third burst length signals BL<4>, BL<8> and BL<16> and then generates the burst operation signal yburst which is enabled at a high level during the burst operation section which is defined by a high-level signal of the first to third burst length signals BL<4>, BL<8> and BL<16>.

The output enable signal generating unit 52 receives the internal clock signal ICLK, the first read signal read, and the write signal write and then generates an output enable signal yien to transfer the data stored in the memory core 6 to the first to eighth global I/O lines GIO<1:8> by turning on switches (not shown), in the read operation.

Figure 6:
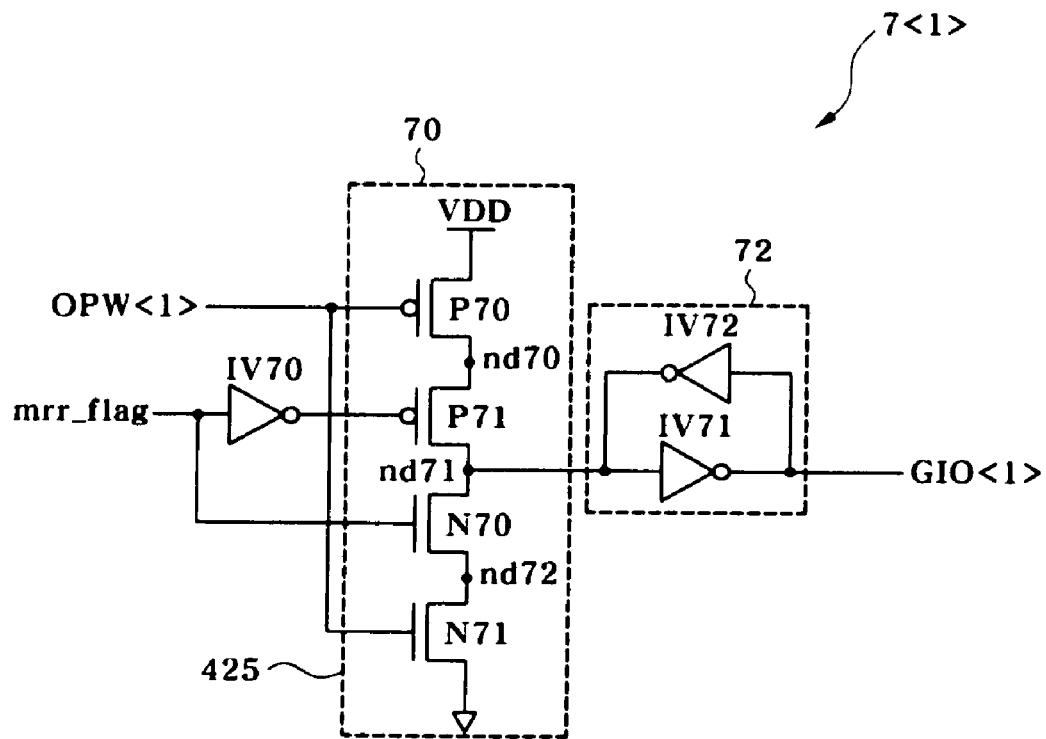
FIG. 6 is a circuit diagram illustrating an example of a structure of a first global I/O line latch unit in the semiconductor memory device of FIG. 1.

As shown in FIG. 6, the first global I/O line latch unit 7<1> includes a PMOS transistor P70 coupled between the power supply voltage VDD and a node nd70 and turned on in response to the first output information signal OPW<1>, a PMOS transistor P71 coupled between the node nd70 and a node nd71 and turned on in response to an inverted signal of the flag signal mrr_flag, an NMOS transistor N70 coupled between the node nd71 and a node nd72 and turned on in response to the flag signal mrr_flag, and a NMOS transistor N71 coupled between the node nd72 and the ground voltage level VSS and turned on in response to the first output information signal OPW<1>. A latch unit 72 latches an output signal on the node nd71 and then transfers the latched signal to the first global I/O line GIO<1>.

In the case of the second to eighth global I/O line latch units 7<2:8> each of which has the same configuration as the first global I/O line latch unit 7<1>, the respective second to eighth output information signals OPW<2:8> are input instead of the first output information signals OPW<1> and the latched data are outputted into the respective second to eighth global I/O lines GIO<2:8> instead of the first global I/O lines GIO<1>. Accordingly, a detailed description of each of the second eighth global I/O line latch unit 7<2:8. Individually will be omitted.

The read clock generating unit 8 receives the second read signal r_mrr and the internal clock signal ICLK and then generates a read clock signal rd_CLK which controls an output of the data transferred through the first to eighth global I/O lines GIO<1:8>.

The pipe latch unit 9 transfers the data, which are transferred through the first to eighth global I/O lines GIO<1:8>, to the first to eighth DQ pads 10<1:8>, respectively, in response to the read clock signal rd_CLK and an I/O line select signal IO_select as first to eighth rising data RDO<1:8>, respectively, and first to eighth falling data FDO<1:8>, respectively.

Figure 7:
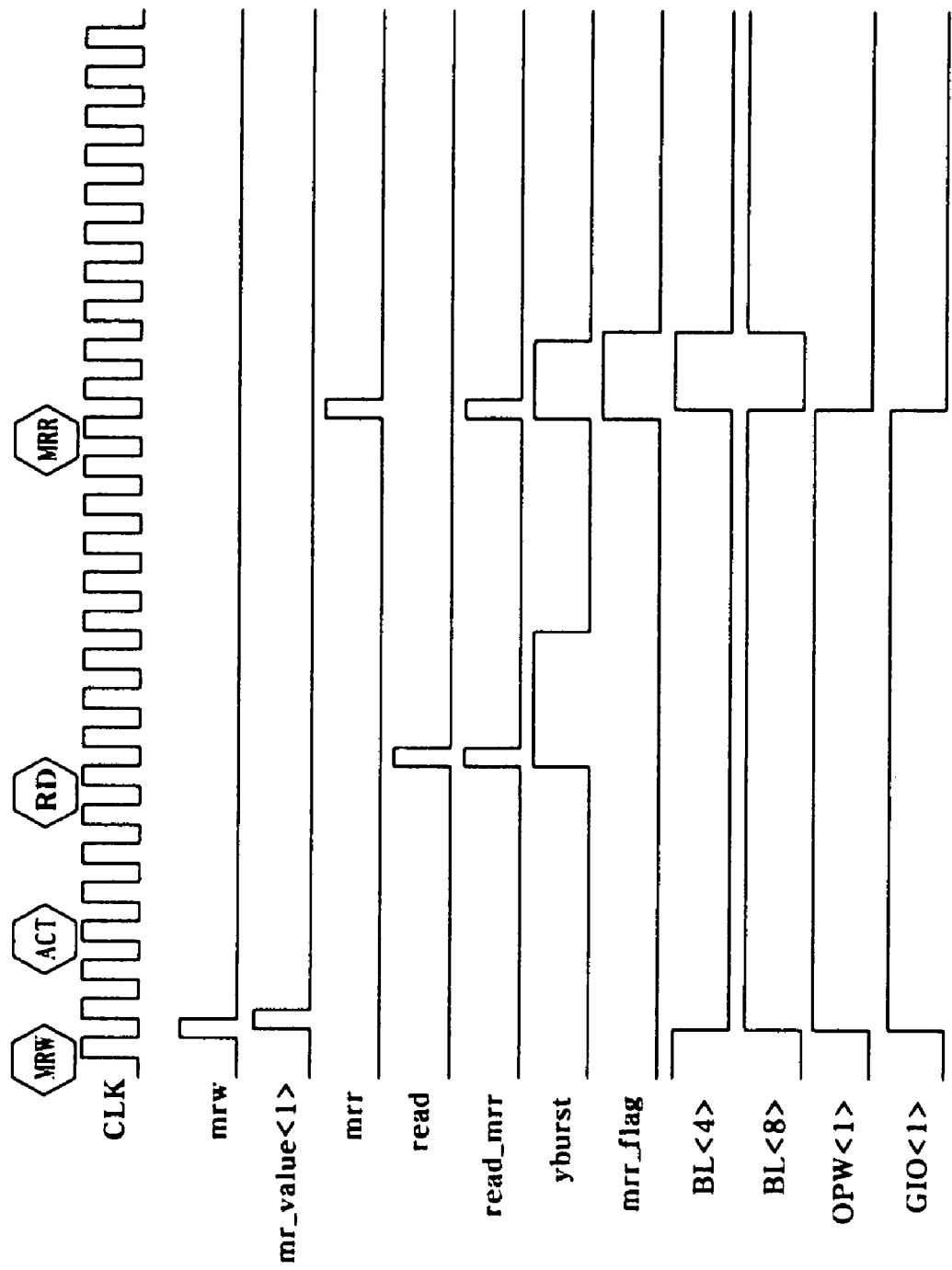
FIG. 7 is a timing chart illustrating an operation of the semiconductor memory device shown in FIG. 1.

Assuming that a mode register write operation, a read operation, and a mode register read operation are executed in this order, these operations will be described in detail referring to FIG. 7.

First, the mode register write operation according to an embodiment of the present disclosure will be described in detail.

When the first to ninth command address signals CA<1:9> are inputted to execute the mode register write operation, the command decoder 2 receives the command signal command, which is extracted from the command address buffer 1, and then enables the mode register write signal mrw at a high level.

If the mode register write signal mrw is enabled at a high level, the decoder 40 included in the mode register control unit 4 decodes the address signals address and then generates the first to eighth information signals mrw_value<1:8> and the first and second select signal mrw_mode<1:2>. At this time, it is assumed that the first information signal mrw_value<1>, the second to eighth information signals mrw_value<2:8>, the first select signal mrw_mode<1> and the second select signal mrw_mode<2> are at high, low, high and low levels, respectively.

In a state where the mode register write signal mrw is enabled at a high level, the transfer gate T40 is turned on when the first select signal mrw_mode<1> is at a high level. Further, since the node nd41 is driven by the driving unit 426 which operates in response to the high level signal of the mode register write signal mrw, a signal on the node nd43 has the same voltage level as the first information signal mrw_value<1>. At this time, since the transfer gate T40 is turned on, the signal on the node nd43 is stored in the first register 424.

As mentioned above, when the mode register write signal mrw is at a high level, the first information signal mrw_value<1> is stored in the first register 424 which is selected by the first and second select signals mrw_mode<1:2>. Similar to the first information signal mrw_value<1>, the second to eighth information signals mrw_value<2:8> are stored in the registers which are set up by the select signals.

Next, the read operation of the semiconductor memory device will be described in detail according to an embodiment of the present disclosure.

When the first to ninth command address signals CA<1:9> are inputted to execute the read operation, the command decoder 2 receives the command signal command, which is extracted from the command address buffer 1 and then enables the first read signal read at a high level.

The logic unit 3, which receives the high level signal of the first read signal read, generates the second read signal r_mrr at a high level and the read clock generating unit 8, which receives the second read signal r_mrr, generates the read clock signal rd_CLK.

Meanwhile, the output enable signal generating unit 52 receives the first read signal read at a high level and then generates the output enable signal yien which is enabled at a high level. The data stored in the memory core 6 are transferred to the global I/O lines GIO<1:8> in response to the output enable signal yien, which is enabled at a high level, and outputted to the first to eighth DQ pads 10<1:8> through the pipe latch unit 9 in response to the read clock signal rd_CLK.

The read operation mentioned above is similar to a conventional read operation; however, the second read signal r_mrr inputted into the read clock generating unit 8, which generates the read clock signal rd_CLK, is transited to a high level by the mode register read signal mrr.

Next, the mode register read operation according to an embodiment of the present disclosure will be described in detail.

When the first to ninth command address signals CA<1:9> are inputted to execute the mode register read operation, the command decoder 2 receives the command signal command, which is extracted from the command buffer 1, and then enables the mode register read signal mrr at a high level.

The logic unit 3, which receives the high level signal of the mode register read signal mrr, generates the second read signal r_mrr at a high level and the read clock generating unit 8, which receives the second read signal r_mrr, generates the read clock signal rd_CLK.

If the mode register read signal mrr is enabled at a high level, the decoder 40 included in the mode register control unit 4 decodes the address signals address and then generates the first and second select signals mrw_mode<1:2>. At this time, it is assumed that the first select signal mrw_mode<1> and the second select signal mrw_mode<2> are at high and low levels, respectively.

In a state where the mode register read signal mrr is enabled at a high level, the transfer gate T40 is turned on when the first select signal mrw_mode<1> is at a high level. That is, the data, which are stored at a high level in the above-mentioned mode register write operation, are outputted as the output information signal OPW<1>. Likewise, the second to eighth output information signals OPW<2:8> are outputted by the second to eighth drivers 42<2:8>, respectively.

Meanwhile, the flag signal generating unit 44, which receives the mode register read signal mrr of the high level, generates the flag signal mrr_flag. The flag signal mrr_flag generated by the flag signal generating unit 44 is transited to a high level starting from a transition section in which the mode register read signal mrr is transited to a high level, and the flag signal mrr-flag is transited to a low level at a transition section in which the pulse signal pulse is transited to a low level. At this time, the pulse signal pulse maintains a low level during the delay section of the delay unit 441 after the burst operation section is terminated. Accordingly, the flag signal mrr_flag is enabled at a high level starting from the transition section in which the mode register read signal mrr is transited to a high level, and is enabled during the burst operation section.

As mentioned above, when the mode register read signal mrr is transited to a high level, the burst control unit 5 outputs the first burst length signal BL<4> at a high level and outputs the second and third burst length signals BL<8> and BL<16> at a low level regardless of the initial burst length signals BLO<4>, BLO<8> and BLO<16> because the flag signal mrr_flag is transited to a high level. Therefore, the enable section of the flag signal mrr_falg is determined by the burst operation section which is determined by the first burst length signal BL<4>.

Meanwhile, the first to eighth output information signals OPW<1:8>, which are outputted from the first to eighth drivers 42<1:8>, respectively, are loaded on the first to eighth global I/O lines GIO<1:8>, respectively, through the first to eighth global I/O line latch units 7<1:8>, respectively. For example, the first output information signal OPW<1> of a high level is buffered by the driving unit 70 during the high level section of the flag signal mrr_flag and it is loaded on the first global I/O line GIO<1> through the latch unit 72.

The data, the first to eighth output information signal OPW<1:8> loaded on the first to eighth global I/O lines GIO<1:8>, respectively, are outputted to the first to eighth DQ pads 10<1:8>, respectively, through the pipe latch unit 9 in response to the read clock signal rd_CLK.

As should be apparent from this disclosure, the semiconductor memory device provides the mode register write operation capable of supporting and modifying various operation modes and outputting the mode register information using the DQ pads which are used for outputting the stored data in the memory cells with the same data path. Therefore, the semiconductor memory device can verify the mode register information, which is currently set up, by verifying the output information that are outputted from the DQ pads in the mode register write operation Although examples and embodiments of the present invention have been described for illustrative purposes, those skilled in the art will appreciate that various modifications, additions and substitutions are possible, without departing from the scope and spirit of this disclosure and the accompanying claims.

The present disclosure claims priority to Korean application 10-2008-0076204, filed on Aug. 4, 2008, the entire contents of which are incorporated herein by reference.

What is claimed is:

1. A semiconductor memory device comprising:
a mode register control unit configured to receive address signals, a mode register write signal and a mode register read signal, and generate a flag signal and at least one output information signal; and
a global I/O line latch unit for transferring the output information signal to a global I/O line in response to the flag signal.

2. The semiconductor memory device of claim 1, wherein the mode register control unit includes:

a decoder for decoding the address signals and generating at least one information signal and first and second select signals by;

at least one driver configured to receive the information signal and the first and second select signals, and generate the output information signal in response to the mode register write signal and the mode register read signal; and a flag signal generating unit configured to receive the mode register read signal and a burst operation signal, and generate the flag signal.

3. The semiconductor memory device of claim 2, wherein the driver stores the information signal in a register selected by the first and second select signals when the mode register write signal is enabled, and outputs the information signal stored in the register as the output information signal when the mode register read signal is enabled.

4. The semiconductor memory device of claim 2, wherein the driver includes:

a transfer unit, including first and second transfer gates selectively turned on in response to the first and second select signals when the mode register write signal or the mode register read signal is enabled;

a driving unit for driving a first node in response to the information signal when the mode register write signal is enabled; and a latch unit for outputting a signal on the first node to a second node, and including a first register coupled to the second node through the first transfer gate which is turned on and a second register is coupled to the second node through the second transfer gate which is turned on.

5. The semiconductor memory device of claim 4, wherein the transfer unit further includes:

a first logic unit for performing a logic operation of the mode register write signal and the mode register read signal;

a second logic unit for performing a logic operation of an output signal of the first logic unit and the first select signal; and a third logic unit for performing a logic operation of an output signal of the second logic unit and the second select signal, wherein the first transfer gate is turned on by the output signal of the second logic unit and the second transfer gate is turned on by an output signal of the third logic unit.

6. The semiconductor memory device of claim 5, wherein the first logic unit performs logic summation and each of the second and third logic units performs logic multiplication.

7. The semiconductor memory device of claim 2, wherein the flag signal generating unit includes:

a pulse signal generating unit for the burst operation signal and generating a pulse signal configured to receive; and a driving unit configured to receive the pulse signal and the mode register read signal and drive an output node.

8. The semiconductor memory device of claim 7, wherein the pulse signal generating unit includes:

a delay unit for delaying the burst operation signal for a predetermined time and inverting the delayed burst operation signal; and a logic unit for performing a logic operation of the burst operation signal and an output signal of the delay unit.

9. The semiconductor memory device of claim 8, wherein the logic unit performs logic summation.

10. The semiconductor memory device of claim 7, wherein the driving unit includes:

a pull-up element coupled between a power supply voltage and the output node to perform a pull-up operation at the output node in response to the pulse signal; and a pull-down element coupled between the output node and a ground voltage level to perform a pull-down operation at the output node in response to the mode register read signal.

11. The semiconductor memory device of claim 7, wherein the flag signal generating unit further includes a latch unit for latching a signal on the output node.

12. The semiconductor memory device of claim 1, wherein the global I/O line latch unit includes:

a driving unit configured to receive the output information signal and drive an output node in response to the flag signal; and a latch unit for latching a signal on the output node and transferring the latched signal to the global I/O line.

13. The semiconductor memory device of claim 12, wherein the driving unit drives the output node in response to the output information signal when the flag signal is enabled.

14. The semiconductor memory device of claim 1, further comprising a burst control unit for setting up and outputting a plurality of burst length signals in response to the flag signal.

15. The semiconductor memory device of claim 14, wherein the burst control unit enables one of the plurality of the burst length signals, which is preset, when the flag signal is enabled.

16. The semiconductor memory device of claim 14, wherein the burst control unit includes:

a first logic unit for performing a logic operation of a first initial burst length signal and the flag signal; and a second logic unit for performing a logic operation of a second initial burst length signal and an inverted signal of the flag signal.

17. A semiconductor memory device comprising:

a command address buffer unit for buffering command address signals and then extracting address signals and command signals;

a command decoder for decoding the command signals in synchronization with an internal clock signal and then generating a mode register write signal and a mode register read signal;

a mode register control unit configured to receive the address signals, the mode register write signal and the mode register read signal and generate a flag signal and at least one output information signal;

a latch unit for transferring the output information signal to a global I/O line in response to the flag signal; and a burst control unit for setting up and outputting a plurality of burst length signals in response to the flag signal.

18. The semiconductor memory device of claim 17, wherein the mode register control unit includes:

a decoder for decoding the address signals and generating at least one information signal and first and second select signals by decoding the address signals;

at least one driver configured to receive the information signal and the first and second select signals and generate the output information signal in response to the mode register write signal and the mode register read signal; and a flag signal generating unit configured to receive the mode register read signal and a burst operation signal and generate the flag signal.

19. The semiconductor memory device of claim 18, wherein the driver stores the information signal in a register which is selected by the first and second select signals when the mode register write signal is enabled, and outputs the information signal stored in the register as the output information signal when the mode register read signal is enabled.

20. The semiconductor memory device of claim 18, wherein the driver includes:
- a transfer unit including first and second transfer gates selectively turned on in response to the first and second select signals when the mode register write signal or the mode register read signal is enabled;
- a driving unit for driving a first node in response to the information signal when the mode register write signal is enabled; and
- a latch unit for outputting a signal on the first node to a second node, and including a first register coupled to the second node through the first transfer gate which is turned on and a second register coupled to the second node through the second transfer gate which is turned on.

21. The semiconductor memory device of claim 20, wherein the transfer unit further includes:
- a first logic unit for performing a logic operation of the mode register write signal and the mode register read signal;
- a second logic unit for performing a logic operation of an output signal of the first logic unit and the first select signal; and
- a third logic unit for performing a logic operation of an output signal of the second logic unit and the second select signal, wherein the first transfer gate is turned on by the output signal of the second logic unit and the second transfer gate is turned on by an output signal of the third logic unit.

22. The semiconductor memory device of claim 18, wherein the flag signal generating unit includes:
- a pulse signal generating unit configured to receive the burst operation signal and generate a pulse signal; and
- a driving unit configured to receive the pulse signal and the mode register read signal and drive an output node.

23. The semiconductor memory device of claim 22, wherein the pulse signal generating unit includes:
- a delay unit for delaying the burst operation signal for a predetermined time and inverting the delayed burst operation signal; and
- a logic unit for performing a logic operation of the burst operation signal and an output signal of the delay unit.

24. The semiconductor memory device of claim 22, wherein the driving unit includes:
- a pull-up element coupled between a power supply voltage and the output node to perform a pull-up operation at the output node in response to the pulse signal; and
- a pull-down element coupled between the output node and a ground voltage level to perform a pull-down operation at the output node in response to the mode register read signal.

25. The semiconductor memory device of claim 17, wherein the global I/O line latch unit includes:
- a driving unit configured to receive the output information signal and drive an output node in response to the flag signal; and
- a latch unit for latching a signal on the output node and transferring the latched signal to the global I/O line.

26. The semiconductor memory device of claim 25, wherein the driving unit drives the output node in response to the output information signal when the flag signal is enabled.

27. The semiconductor memory device of claim 17, wherein the burst control unit enables one of the plurality of the burst length signals, which is preset, when the flag signal is enabled.

28. The semiconductor memory device of claim 17, wherein the burst control unit includes:
- a first logic unit for performing a logic operation of a first initial burst length signal and the flag signal; and
- a second logic unit for performing a logic operation of a second initial burst length signal and an inverted signal of the flag signal.

* * * * *